PULSE COUNTER

Filed June 21, 1963 2 Sheets-Sheet 1

INVENTOR.
ROBERT N. HURST
BY John V. Regan
Attorney

Sept. 12, 1967 R. N. HURST 3,341,693

PULSE COUNTER

Filed June 21, 1963 2 Sheets-Sheet 2

INVENTOR.
ROBERT N. HURST
BY John V. Regan
Attorney

United States Patent Office 3,341,693
Patented Sept. 12, 1967

3,341,693

PULSE COUNTER

Robert N. Hurst, Cherry Hill, N.J., assignor to Radio Corporation of America, a corporation of Delaware Filed June 21, 1963, Ser. No. 289,501
5 Claims. (Cl. 235—92)

This invention relates to pulse counters, and more particularly to circuits and methods for causing binary pulse counters to count in a non-binary manner.

A binary counter is normally defined as a counter which counts by powers of two. It is frequently desirable for a pulse counter to be capable of counting in a non-binary manner, i.e., by counting in a manner other than by powers of two, as well as in a binary manner.

It is an object of this invention to provide a pulse counter which counts in a non-binary manner.

It is another object of this invention to provide a pulse counter operable to count in either a binary or a non-binary manner.

It is a further object of this invention to provide a variable base pulse counter.

A pulse counter, in accordance with the invention, includes an input gate coupled to apply input pulses to be counted to a binary counter. The input gate is periodically inhibited to cancel input pulses selectively so as to cause the pulse counter to count in a non-binary manner.

In one physical exemplification of the invention, the pulse counter includes a plurality of bistable devices connected in cascade so as to operate as a binary counter. An input gate is coupled to apply input pulses to be counted to said binary counter. Means, under the control of said input pulses and selected ones of said bistable devices, are coupled to periodically inhibit said input gate to cancel selected input pulses so as to cause the pulse counter to count in a non-binary manner.

Figure 1:
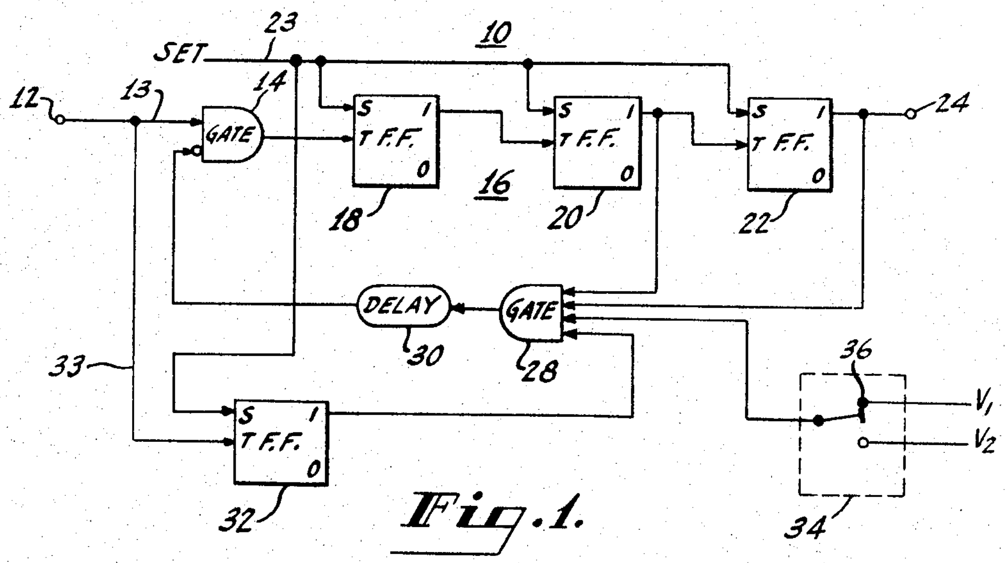
FIGURE 1 is a schematic block diagram of a pulse counter embodying the invention.

Referring to FIGURE 1, a pulse counter 10 includes an input terminal 12 to which pulses to be counted are applied. The input terminal 12 is coupled via a first input line 13 to a direct input terminal of an input coincidence inhibit gate 14. The coincidence gate 14 also includes an inhibit input terminal, as denoted by the small circle in the schematic of FIGURE 1. The coincidence gate 14 produces an output signal only when there occurs the coincidence of a signal present at the direct input terminal thereof, and the absence of a signal at the inhibit input terminal thereof. The output of the gate 14 is coupled to a binary counter 16 which includes a plurality of bistable devices 18, 20 and 22. The bistable devices 18, 20 and 22 may, for example, comprise triggerable flip-flops having a trigger input terminal T and a pair of output terminals 1 and 0 corresponding, respectively, to the set and reset stable operating states thereof. Each bistable device is triggered from one stable state to the other by the leading edge of a positive-going pulse applied to the trigger input terminal T thereof. Each bistable device also includes a set terminal S to which a set pulse of sufficient width may be applied via a set line 23 to set all the bistable devices.

The input gate 14 is connected to the input terminal

T of the first bistable device 18 and the bistable devices 18, 20 and 22 are then cascaded by connecting the "1" output terminal of each device directly to the trigger T input terminal of the next succeeding bistable device. The "1" output terminal of the last bistable device 22 is coupled to an output terminal 24 for the pulse counter 10.

Control means are included in the pulse counter 10 to cause the counter to count in a non-binary manner. The control means includes a control coincidence gate 28, the output of which is coupled through a delay circuit 30 to the inhibit input terminal of the input gate 14. The input gate 14 is inhibited, after a delay introduced by the delay circuit 30, when the control gate 28 is activated. The control means also includes a control bistable device 32 which may, for example, be identical to the bistable devices 18, 20 and 22. The input pulses to be counted are applied to the input terminal T of the bistable device 32 via a second input line 33. The "1" output terminals of the control bistable device 32 and the bistable devices 20 and 22 of the binary counter 16 are coupled to the input terminals of the control gate 28.

Switching means 34 is included in the pulse counter 10 to apply an enabling signal to the control gate 28 when operated in a first condition, and to apply a disabling signal to the gate 28 when operated in a second condition. The switching means 34 may comprise a single pole, double-throw switch 36, and is so illustrated in FIGURE 1, or it may comprise a bistable device. When the switch 36 is operated in its first position, a voltage $V_1$ is applied to inhibit or block the gate 28. The voltage $V_1$ may, for example, be zero or of a negative polarity. When the switch 36 is operated in its second condition, a voltage $V_2$ of, for example, positive polarity is applied to enable the gate 28.

Figure 2:
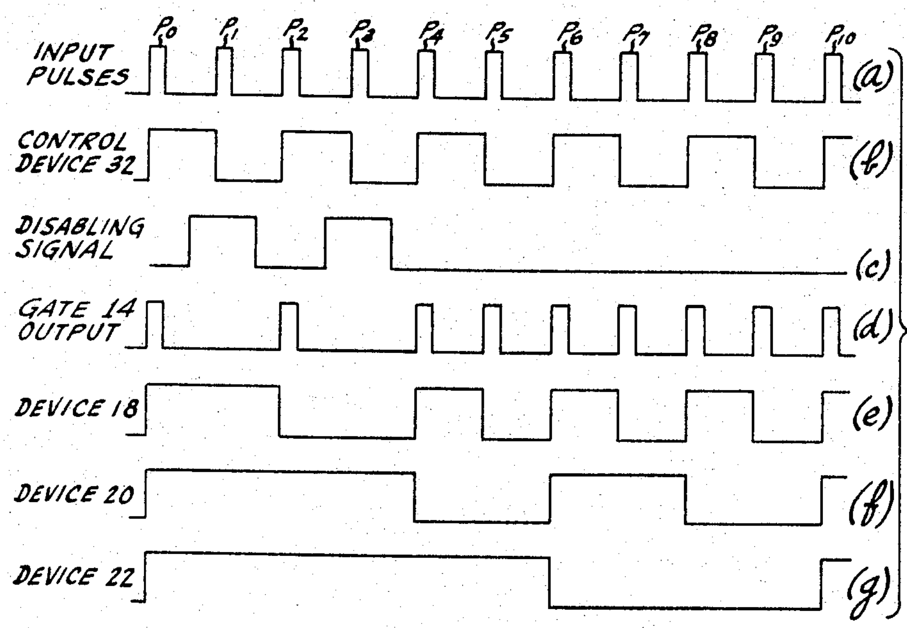
FIGURES 2 and 3 are timing diagrams illustrating the operation of the pulse counter of FIGURE 1 when operated as a non-binary counter and as a binary counter, respectively.
Figure 3:
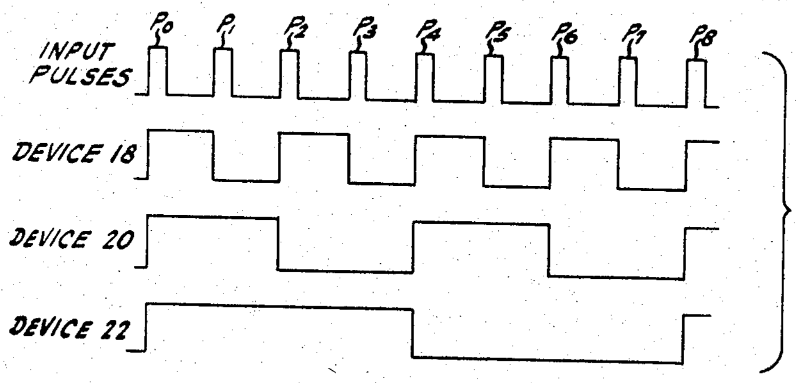

In describing the operation of the pulse counter 10 of FIGURE 1, reference will be made to the timing diagrams shown in FIGURES 2 and 3. In FIGURE 2, there are shown the various signals appearing in the pulse counter 10 when the switch 34 is thrown to connect the enabling potential $V_2$ to the control gate 28. Line *a* of FIGURE 2 shows a train of input pulses $P_0$–$P_{10}$ which are to be counted by the pulse counter 10. The input pulses may be periodic or aperiodic. In FIGURE 2, for convenience, the input pulses are shown as being periodic. The input pulse $P_0$ may be the last pulse of one cycle of pulses to be counted and the pulse $P_1$ is the first pulse of the next cycle. On the last pulse of a cycle, all of the bistable devices 18, 20, 22 and 32 are in their reset state. The control gate 28 is therefore disabled and produces no output. Thus, no disabling signal is applied to the input gate 14 when the pulse $P_0$ arrives, as shown in line *c* of FIGURE 2. The pulse $P_0$ is therefore passed by the input gate 14. The bistable devices 18, 20 and 22 are triggered successively to their set states by the output pulse of the gate 14, line *d* of FIGURE 2. The devices 18, 20 and 22 are shown (lines *e*, *f* and *g*) as being triggered simultaneously, for simplification, even though there is a slightly delay introduced by each successive device. The input pulse $P_0$ also sets the control bistable device 20 as shown in line *b*.

The control gate 28 is activated by the setting of the bistable devices 20, 22 and 32 and applies a disabling signal (line *c*, FIGURE 2) to the input gate 14 after a delay introduced by the delay circuit 30. The disabling signal blocks the input pulse $P_1$ which is the first pulse of the next cycle and the bistable devices 18, 20 and 22 remain set. However, the control device 32 is reset by the input pulse $P_1$, which resetting deactivates the control gate 28 and removes the disabling signal from the input gate 14.

The delay introduced by the delay circuit 30 is selected to be slightly longer than the duration of an input pulse. The pulse width of the disabling signal is the same as the pulse width of the output signal of the control device 32. Thus, input pulses from a pulse source may be aperiodic and will still be counted. For example, if the pulse $P_1$ is much closer in time to the pulse $P_0$ than it is to the pulse $P_2$, the control device 32 is set and then reset on the leading edges of the pulses $P_0$ and $P_1$, respectively. The leading edge of the disabling pulse signal is generated slightly after the end of the pulse $P_0$ and the disabling pulse cancels the pulse $P_1$. The trailing edge of the disabling pulse occurs slightly after the end of the pulse $P_1$ due to the setting of the control device 32 by the leading edge of the pulse $P_1$. Thus, the pulse $P_1$ will be cancelled even though the input pulses occur aperiodically.

The next input pulse $P_2$ of the line *a* of FIGURE 2 is passed by the input gate 14 due to the absence of a disabling signal. The pulse $P_2$ resets the bistable device 18 (line *e*) in the binary counter 16. The "1" to "0" transition of the device 18 does not trigger the succeeding device 20 which remains set. The input pulse $P_2$ also sets the bistable device 32 (line *b*). Thus, a second disabling signal (line *c*) is applied to the input gate 14 which blocks the input pulse $P_3$. However, the pulse $P_3$ resets the control bistable device 32 and removes the disabling signal. Thus, up to this time, input pulses $P_1$ and $P_3$ are blocked and effectively only one of the three applied input pulses of the cycle beginning at the pulse $P_1$ are counted by the binary counter 16.

The input pulse $P_4$ is passed by the input gate 14 and sets the bistable device 18. The positive-going leading edge of the output signal produced at the "1" output terminal of the bistable device 18 due to the "0" to "1" transition thereof triggers the bistable device 20 to the reset state which disables the control gate 28. The pulses $P_5$ and $P_6$ successively reset and set the bistable device 18 and the setting of the device 18 in turn sets the bistable device 20. The positive-going leading edge of the output signal from the "1" output terminal of the bistable device 20 resets the bistable device 22. Since the bistable device 22 is reset, the control gate 28 remains disabled.

The input pulse $P_8$ sets the bistable device 18 which in turn resets the bistable device 20. The pulse $P_9$ resets the bistable device 18. Consequently, all of the bistable devices 18, 20 and 22 are in their reset condition. The next input pulse $P_{10}$ sets all of the bistable devices 18, 20 and 22 and produces a positive-going output signal at the output terminal 24 of the pulse counter 10. Thus, the bistable device 22 is set at the input pulses $P_0$ and $P_{10}$ and this cycle repeats itself for every ten input pulses. The pulse counter 10 therefore operates as a decade (nonbinary) counter when the switch 34 is in its first operating position. A set pulse may be applied via the set line 23 to set all of the bistable devices 18, 20 and 22 to begin a new cycle at any time.

When the switch 34 is in its second operating position, the potential source $V_2$ is connected to disable the control gate 28. Thus, the input gate 14 remains enabled for all of the input pulses. The pulse counter 10, when operated in this condition, operates as an octal (binary) counter, as shown by the timing diagram of FIGURE 3.

Figure 4:
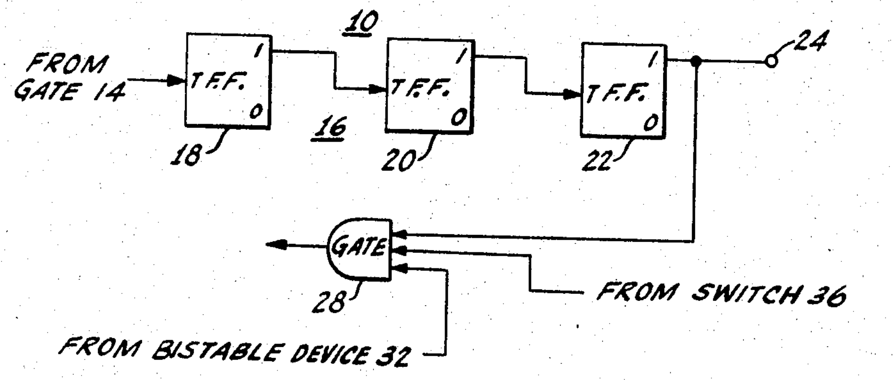
FIGURE 4 is a simplified schematic block diagram useful for illustrating another embodiment of the invention.

The pulse counter is flexible in the sense that varying the connections of the bistable devices 18, 20 and 22 to the control gate 28 results in different base counters from that shown in FIGURE 1. In FIGURE 4, a fragment of the pulse counter 10 is shown which counts in the base twelve. The same reference numerals are used for parts identical to those in FIGURE 1. The only change in FIGURE 4 from FIGURE 1 is the removal of the connection from the bistable device 20 to the control gate 28. However, this change causes the input pulses $P_1$, $P_3$, $P_5$ and $P_7$ to be blocked. A positive output is produced at the pulse $P_{12}$ and the pulse counter counts by twelve.

Thus, a pulse counter is provided which may be operated to count in either a binary or a non-binary manner.

What is claimed is:

1. A pulse counter for counting input pulses comprising in combination:
   - a plurality of bistable devices serially connected from a first one to a last one to operate as a binary counter to count said input pulses,
   - an input gate coupled to said first one of said bistable devices,
   - means for applying all of said input pulses to said input gate,
   - first means coupled to said input gate for cancelling selected input pulses by selectively inhibiting said input gate to block said selected pulses from passing through said input gate, and
   - second means for deriving from said last one of said bistable devices an output that provides a nonbinary count of said input pulses and simultaneously provides a binary count of the pulses passed through said input gate.

2. The combination in accordance with claim 1 wherein said first means inhibits said input gate under the joint control of said input pulses and at least one of said plurality of bistable devices.

3. The combination in accordance with claim 1 wherein said first means comprises:
   - a control gate coupled to said input gate to inhibit said input gate when said control gate is activated,
   - a control bistable device having a pair of stable operating states,
   - means for applying said input pulses to said control bistable device to switch said control bistable device alternately between said pair of stable operating states, and
   - means coupling said control bistable device and at least one of said plurality of bistable devices to said control gate to selectively activate said control gate to selectively inhibit said input gate to prevent selected ones of said input pulses from passing through said input gate.

4. The combination in accordance with claim 3 that further includes:
   - a delay circuit exhibiting a predetermined time delay greater than the duration of said input pulses, and
   - means for coupling said control gate through said delay circuit to said input gate to inhibit said input gate after said predetermined time delay when said control gate is activated.

5. The combination in accordance with claim 4 that further includes:
   - switching means coupled to said control gate and operable between a first position wherein said control gate is deactivated to prevent cancelling of said input pulses so as to cause said pulse counter to count in a binary manner, and
   - a second position wherein said control gate is conditioned to be activated to inhibit said input gate to block selected ones of said input pulses so as to cause said pulse counter to count in a nonbinary manner.

References Cited

UNITED STATES PATENTS

| | | | |
|---|---|---|---|
| 2,824,961 | 2/1958 | Paivinen | 235—92 |
| 2,828,071 | 2/1958 | Burton | 235—92 |
| 2,927,206 | 3/1960 | Gallee | 328—42 |
| 3,078,417 | 2/1963 | Nick | 235—92 |
| 3,141,959 | 7/1964 | Motooka | 235—92 |
| 3,156,870 | 11/1964 | Nixon | 328—51 X |
| 3,209,130 | 9/1965 | Schmidt | 235—92 |
| 3,209,347 | 9/1965 | Cutaia | 328—49 X |

MAYNARD R. WILBUR, *Primary Examiner.*

JOHN F. MILLER, DARYL W. COOK, *Examiners.*

G. MAIER, *Assistant Examiner.*